United States Patent [19]
Koshiishi et al.

[11] Patent Number: 5,972,799
[45] Date of Patent: Oct. 26, 1999

[54] DRY ETCHING METHOD

[75] Inventors: Akira Koshiishi, Kofu; Ryuji Honda, Nakakoma-gun, both of Japan

[73] Assignee: Tokyo Electron Limited, Tokyo, Japan

[21] Appl. No.: 08/998,200

[22] Filed: Dec. 29, 1997

[30] Foreign Application Priority Data

Jan. 8, 1997 [JP] Japan .................................. 9-013402

[51] Int. Cl.$^6$ .................................................. H01L 21/311
[52] U.S. Cl. ............................................ 438/723; 438/743
[58] Field of Search ................................. 438/723, 743

[56] References Cited

U.S. PATENT DOCUMENTS 5,770,098  6/1998  Araki et al. .............................. 216/67

FOREIGN PATENT DOCUMENTS 61-133630  6/1986  Japan .
4-170026  6/1992  Japan .
4-346428  12/1992  Japan .

*Primary Examiner*—Bruce Breneman
*Assistant Examiner*—Allan Olsen
*Attorney, Agent, or Firm*—Smith, Gambrell & Russell; Beveridge, DeGrandi, Weilacher & Young Intellectual Property Group

[57] ABSTRACT

There is provided a dry etching method which does not contribute to earth anathermal due to the green house effect and which has a good etching characteristics. According to the present invention, the flow rates of Ar, $O_2$, and $C_3F_6$ supplied from gas sources 152, 154 and 156 are regulated by a mass flow controller MFC 146, 148 and 150 and valves 140, 142 and 144, respectively, to be mixed. The mixed gas is introduced onto a wafer W via a gas introducing pipe 138, a gas inlet 134, a space 130 and through holes 124a while the flow ratio of $O_2$ to $C_3F_6$ is set to be $0.1 \leq O_2/C_3F_6 \leq 1.0$ and the partial pressure of $C_3F_6$ is set to be in the range of from 0.5 mTorr to 2.0 mTorr.

2 Claims, 7 Drawing Sheets

| FLOW RATE OF $C_3F_6$ (sccm) | 3 | 7 | 13 | 20 | 26 | 30 | 34 |
|---|---|---|---|---|---|---|---|
| PARTIAL PRESSURE OF $C_3F_6$ (mTorr) | 0.21 | 0.49 | 0.90 | 1.37 | 1.76 | 2.02 | 2.27 |
| FLOW RATIO $O_2/C_3F_6$ | 1.00 | 0.43 | 0.23 | 0.15 | 0.12 | 0.1 | 0.09 |
| ETCHING RATE (nm/min) | 210 | 550 | 650 | 655 | 600 | 530 | 300 |
| ETCH SELECTIVITY TO PHOTORESIST | 2.1 | 5.1 | 7.1 | 7.2 | 7.1 | 7.5 | 8.0 |
| CONTACT HOLE MAKING ABILITY* | ○ | ○ | ○ | ○ | ○ | △ | × |

\* ○ CONTACT HOLE OF 0.4 μm CAN BE FORMED AT ASPECT RATIO 8
△ CONTACT HOLE OF 0.4 μm CAN BE FORMED AT ASPECT RATIO 5
× CONTACT HOLE OF 0.4 μm CAN NOT BE FORMED UNLESS ASPECT RATIO IS BELOW 2

FIG.2

| TOTAL PRESSURE (mTorr) | 10 | 20 | 30 | 40 | 60 | 80 | 90 | 100 | 120 |
|---|---|---|---|---|---|---|---|---|---|
| PARTIAL PRESSURE OF $C_3F_6$ (mTorr) | 0.23 | 0.45 | 0.67 | 0.90 | 1.4 | 1.8 | 2.0 | 2.3 | 2.7 |
| ETCHING RATE (nm/min) | 190 | 450 | 620 | 650 | 670 | 690 | 720 | 700 | 650 |
| ETCH SELECTIVITY TO PHOTORESIST | 5.9 | 6.4 | 7.1 | 7.1 | 7.0 | 7.0 | 6.9 | 6.5 | 5.8 |
| CONTACT HOLE MAKING ABILITY* | ○ | ○ | ○ | ○ | ○ | ○ | △ | × | × |

\* ○ CONTACT HOLE OF 0.4 μm CAN BE FORMED AT ASPECT RATIO 8
△ CONTACT HOLE OF 0.4 μm CAN BE FORMED AT ASPECT RATIO 5
× CONTACT HOLE OF 0.4 μm CAN NOT BE FORMED UNLESS ASPECT RATIO IS BELOW 2

FIG.4

| FLOW RATA OF O$_2$ (sccm) | 1 | 2 | 3 | 10 | 15 |
|---|---|---|---|---|---|
| FLOW RATIO O$_2$/C$_3$F$_6$ | 0.08 | 0.15 | 0.23 | 0.76 | 1.15 |
| PARTIAL PRESSURE OF C$_3$F$_6$ (mTorr) | 0.91 | 0.90 | 0.90 | 0.88 | 0.88 |
| ETCHING RATE (nm/min) | 700 | 670 | 650 | 630 | 550 |
| ETCH SELECTIVITY TO PHOTORESIST | 7.5 | 7.3 | 7.1 | 6.5 | 3.9 |
| CONTACT HOLE MAKING ABILITY* | × | △ | ○ | ○ | ○ |

\* ○ CONTACT HOLE OF 0.4 μm CAN BE FORMED AT ASPECT RATIO 8
△ CONTACT HOLE OF 0.4 μm CAN BE FORMED AT ASPECT RATIO 5
× CONTACT HOLE OF 0.4 μm CAN NOT BE FORMED UNLESS ASPECT RATIO IS BELOW 2

FIG.6

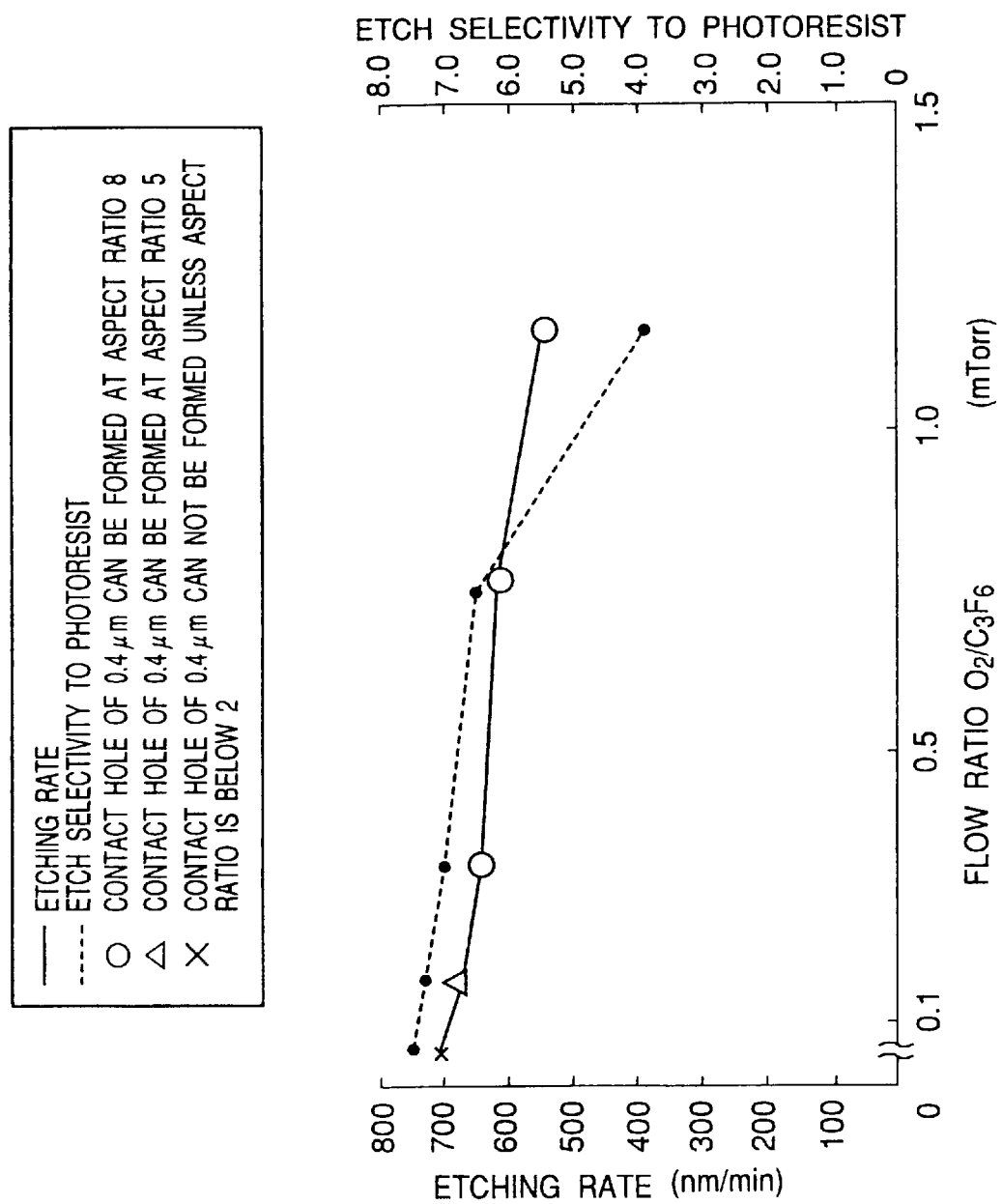

DRY ETCHING METHOD

BACKGROUND OF THE INVENTION

The present invention relates generally to a dry etching method.

In conventionally proposed dry etching methods, an object to be processed is mounted in a sealed processing chamber, and a processing gas is introduced into the processing chamber. Then, the processing chamber is evacuated to a reduced pressure atmosphere. Thereafter, high-frequency power is applied to an electrode formed in the processing chamber to excite plasma, and the object to be processed is etched by etchant ions in the plasma.

In such dry etching methods, etching gases used for etching a silicon oxide layer, e.g., a silicon oxide film (which will be hereinafter referred to as a "$SiO_2$ film"), formed on a surface to be processed, of an object to be processed, e.g., a semiconductor wafer (which will be hereinafter referred to as a "wafer"), include, e.g., $CF_4$, $C_2F_6$, $C_3F_8$, c-$C_4F_8$ and $CHF_3$. It is known that these gases are incombustible, low toxic and low reactive, so that these gases can be safely handled.

Recently $CF_4$, $C_2F_6$, $C_3F_8$, c-$C_4F_8$ and $CHF_3$, c-$C_4F_8$ have been noted in order to fabricate a semiconductor device of a hyperfine structure. For example, it is reported in "ULSI Dry Etching Technology Forum '96 opened on May 21, 1996" that c-$C_4F_8$, which is a gas having a high C/F ratio (a ratio of C atomicity to F atomicity), is effectively used as a processing gas having both of anisotropy and selectivity in a high-density plasma.

If a processing gas introduced into a processing chamber has not contributed to a process, the processing gas is directly emitted to the atmosphere. The $CF_4$, $C_2F_6$, $C_3F_8$, c-$C_4F_8$ and $CHF_3$ have infrared absorbing ability. It is also pointed out in "Climate Change 1995, IPCC, Cambridge Univ. Press" that these gases are very stable and are not easily decomposable if emitted to the atmosphere, and their lifetimes in the atmosphere are very long, 2,600 to 50,000 years, so that these gases cause the earth warming which maintains the green house effect for a long time.

As described in "Science, Vol. 259, Jan. 8, 1993", the reasons why the lifetimes of $CF_4$, $C_2F_6$, $C_3F_8$, c-$C_4F_8$ and $CHF_3$ in the atmosphere are long are that these compounds rarely cause reactions, which are caused by usual compounds in the atmosphere, such as hydrolysis, oxidative decomposition and photolysis, and that radicals existing locally in the atmosphere, e.g., OH, H and O radicals, have very low reactivity with these compounds. It is also reported in "Nikkei Sangyo Shinbun dated on Jul. 1, 1996" that although it is required to take measures to solve the earth anathermal problem due to $CF_4$, $C_2F_6$, $C_3F_8$, c-$C_4F_8$ and $CHF_3$, no measures have been taken.

As processing gases for $SiO_2$ films in conventional sources of plasma of a low degree of dissociation, $CHF_3$ is effective. However, in accordance with the recent miniaturization of semiconductor devices, the pressure of the plasma used for etching processes is decreased, and the density of the plasma is increased. Consequently, if $CHF_3$, which produces a small number of F atoms by discharge dissociation using a source of plasma of a low degree of dissociation, is used for a high-density plasma source, a great number of F atoms are produced by a high gas decomposing efficiency. Moreover, it is pointed out in "ULSI Dry Etching Technology Forum '96 opened on May 21, 1996" that $CHF_3$ is not suitable for etching processes of semiconductor devices, i.e., $SiO_2$ films, which are required to be hyperfine-patterned, since the etch selectivity to Si and the etch selectivity to a resist are decreased if $CHF_3$ is used for a high-density plasma source.

Therefore, in view of the prevention of the earth anathermal and the fine patterning of semiconductor devices, it is considered that as gases substituted for $CF_4$, $C_2F_6$, $C_3F_8$, c-$C_4F_8$ and $CHF_3$, e.g., the same CF type of perfluoro olefins are used. However, most of perfluoro olefins are difficult to handle. In particular, $C_2F_4$ (perfluoroethylene), c-$C_4F_6$ (perfluorocyclobutene) and $C_4F_8$ (perfluoroisobutene or perfluorobutylene) are very difficult to handle. For example, it is described in "12394 Chemical Products by Kagaku Kogyo Nippo-sha" that $C_2F_4$ is an inflammable gas, and very sensitive to moisture, temperature and iron, and causes an explosive reaction. It is also described in "Fluorine Compounds, Kodansha Scientific" that c-$C_4F_6$ has an acute toxicity equal to that of phosgene known as a toxic gas (LC50 is 20 ppm after exposure for 1 hour). Moreover, it is described in the same book that the acute toxicity of $C_4F_8$ is ten times as large as that of phosgene.

However, it is described in "Material Safety Data Sheets, Occupational Health Services Inc." that among perfluoro olefins, most of which are difficult to be handled, only $C_3F_6$ (perfluoropropene) is incombustible and low reactive. It is also described in "Fluorine Compounds, Kodansha Scientific" that $C_3F_6$ (perfluoropropene) has a far lower acute toxicity than those of c-$C_4F_6$ and $C_4F_8$ since LC50 exposed for 4 hours is 3,000 ppm. Moreover, it is considered that the toxicity of $C_3F_6$ is not so high since the high-pressure gas law, which provides that a toxic gas should be controlled in a permissible concentration of below 200 ppm, does not apply to $C_3F_6$ as the toxic gas.

In addition, since it is described in "Material Safety Data Sheets, Occupational Health Service Inc." that $C_3F_6$ is gradually hydrolyzed in the atmosphere, it is difficult to consider that $C_3F_6$ is a compound having a lifetime of thousands years in the atmosphere. Moreover, since it is predicted from the descriptions of "Science, Vol. 259, Jan. 8, 1993" that substances gradually hydrolyzed in the atmosphere have a lifetime of years or less in the atmosphere, it is considered that $C_3F_6$ is not a long-lifetime gas causing the green house effect.

As described above, $C_3F_6$ scarcely causes the green house effect, and can be excellently handled. However, the technology for etching a $SiO_2$ film using $C_3F_6$ has scarcely been reported. In addition, all of currently reported technologies can not effectively carry out etching processes. For example, Japanese Patent Laid-Open No. 4-170026 discloses the technology for controlling the surface temperature of a substrate to be etched, so as to be below 50° C. to etch the substrate using $C_3F_6$. However, since the surface temperature of the substrate to be etched rises abruptly to about 100° C. when the substrate is exposed to plasma during processing, it is required to provide a very large cooling facility in order to control the surface temperature of the substrate to be below 50° C. Furthermore, since a resist is denatured if the surface temperature of the substrate to be etched is higher than 120° C., it is required to control the surface temperature of the substrate to be below 120° C.

In addition, Japanese Patent Laid-Open No. 61-133630 discloses an etching method using a mixed gas of $C_3F_6$ and $CHF_3$. However, it is pointed out in "Climate Change 1995, IPCC, Cambridge Univ. Press" that $CHF_3$ is a gas causing the green house effect, and it is not considered that $CHF_3$ is a practical processing gas. Moreover, comparative data on the etching characteristics of $CHF_3$ and $C_3F_6$ are described in "J. Vac. Sci. Technol., A12(3), May/June 1994" and "J. Vac. Sci. Technol., A12(4), July/August 1994". It is reported therein that, in the reactive ion etching for forming a contact hole and so forth, the etching rate of $C_3F_6$ decreases by a greater value than that of $CHF_3$ as the aspect ratio increases, so that the etching characteristic of $C_3F_6$ is inferior to that of $CHF_3$.

SUMMARY OF THE INVENTION

It is therefore an object of the present invention to eliminate the aforementioned problems and to provide a novel, improved dry etching method, which can carry out an etching process of, e.g., a $SiO_2$ film, formed on a surface of an object to be processed, using $C_3F_6$, which does not cause the earth anathermal and which can be easily handled, so that the etching process has the same etching characteristic as that of, e.g., c-$C_4F_8$, which has a high etching capability.

The present invention relates to a dry etching method comprising the steps of: introducing a processing gas into a pressure-diminishable processing chamber; producing plasma in the processing chamber under a reduced-pressure atmosphere; and etching a silicon oxide layer formed on a surface of an object to be processed in the processing chamber.

In order to accomplish the aforementioned and other objects, according to one aspect of the present invention, the processing gas introduced into the processing chamber is a mixed gas of $C_3F_6$, $O_2$ (oxygen) and Ar (argon). Ions in plasma produced from this mixed gas etch an object to be processed, e.g., a silicon oxide layer, such as a $SiO_2$ film, of a wafer.

In the mixed gas of the present invention, the $C_3F_6$ for producing plasma has difficulty to causing earth anathermal since it is gradually hydrolyzed even if it is emitted to the atmosphere, and the $C_3F_6$ can be easily handled since it is incombustible, and has low reactiveness and low toxicity. In addition, if the mixed gas obtained by adding $O_2$ and Ar to $C_3F_6$ according to the present invention is used, it is possible to solve the conventional problems on the improvement of the etching characteristics of $C_3F_6$ to obtain substantially the same etching characteristics as those of, e.g., c-$C_4F_8$.

That is, if $O_2$ is added, e.g., the deposition of a reaction product adhered to a surface of an object to be processed can be removed by promoting the ashing function, so as to cause the etching to progress. Moreover, since CF radicals having a higher etching capability, i.e., a higher F/C ratio, than the adhesion of the deposition are produced by $O_2$, the etching characteristic can be improved. In addition, since an O radical has a relatively small atomic size so as to reach the bottom of a contact hole, it is possible to remove the deposition adhered to the bottom of a contact hole, at which the ion assist effect is small, so that it is possible to prevent a so-called etching stop.

If Ar is added, it is possible to improve the etching rate by the ion assist effect due to Ar ion produced from Ar. In addition, since Ar has the dilution effect for adjusting the partial pressure of $C_3F_6$ to be a predetermined value while maintaining the total pressure of the mixed gas at a high value, it is not required to provide a vacuum pump having a high pumping speed.

The flow ratio of the $O_2$ to the $C_3F_6$ of the mixed gas may be set to be $0.1 \leq O_2/C_3F_6 \leq 1.0$. Thus, the flow rate of $O_2$ can be adjusted so as to remove, e.g., the deposition adhered to the bottom of the contact hole and so as to prevent the excess ashing of a photoresist formed on the surface to be processed. In addition, the partial pressure of the $C_3F_6$ in the mixed gas may be set to be in the range of from 0.5 mTorr to 2.0 mTorr. Thus, the etching and the adhesion of the deposition can be suitably adjusted, and the etching rate can be maintained to be a desired value while ensuring the aspect ratio of the contact hole.

According to another aspect of the present invention, a dry etching method comprises the steps of: preparing a processing gas being a mixed gas of $C_3F_6$, $O_2$, Ar and He (helium); introducing the processing gas into a pressure-diminishable processing chamber; producing plasma in the processing chamber under a reduced-pressure atmosphere; and etching a silicon oxide layer formed on a surface to be processed, of an object to be processed in the processing chamber.

In this case, He is added to the mixed gas of $C_3F_6$, $O_2$ and Ar. Since He has a smaller atomic radius than that of Ar, if He is added to the mixed gas, it is possible to increase the mean free path, and it is possible to prevent the dispersion due to the impingement of ion species in the contact hole. In addition, since He has a smaller atomic weight than that of Ar, it tends to diffuse in the processing chamber, and since He has a great ionization potential, it can promote the dissociation of $C_3F_6$.

Also in this case, the flow ratio of the $O_2$ to the $C_3F_6$ of the mixed gas may be set to be $0.1 \leq O_2/C_3F_6 \leq 1.0$, and the partial pressure of the $C_3F_6$ in the mixed gas may be set to be in the range of from 0.5 mTorr to 2.0 mTorr. As described above, if He is added to the mixed gas, it is possible to obtain the superior effects. However, since He has a smaller atomic weight than that of Ar, the ion assist effect is small. This problem may be more conspicuous when the amount of He added to the mixed gas exceeds a certain value. Therefore, according to the present invention, He may be introduced while decreasing the amount of Ar added to the mixed gas without changing the partial pressure of $C_3F_6$ and the flow ratio of $O_2$. As a result, it is possible to obtain the advantages of He while maintaining a desired ion assist effect, and it is possible to uniformly process an object to be processed, at a high etch selectivity and at a high etching rate.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 2 is a table showing the results of etching characteristics using the preferred embodiment of a dry etching method according to the present invention, when the flow rate of $C_3F_6$ is changed;

FIG. 4 is a table showing the results of etching characteristics using the preferred embodiment of a dry etching method according to the present invention, when the total pressure of a processing chamber is changed;

FIG. 6 is a table showing the results of etching characteristics using the preferred embodiment of a dry etching method according to the present invention, when the flow rate of $O_2$ is changed; and FIG. 7 is a graph showing the etching characteristics of FIG. 6.

DESCRIPTION OF THE PREFERRED EMBODIMENTS

Referring now to the accompanying drawings, the preferred embodiments of a dry etching method, according to the present invention, will be described in detail below.

Figure 1:
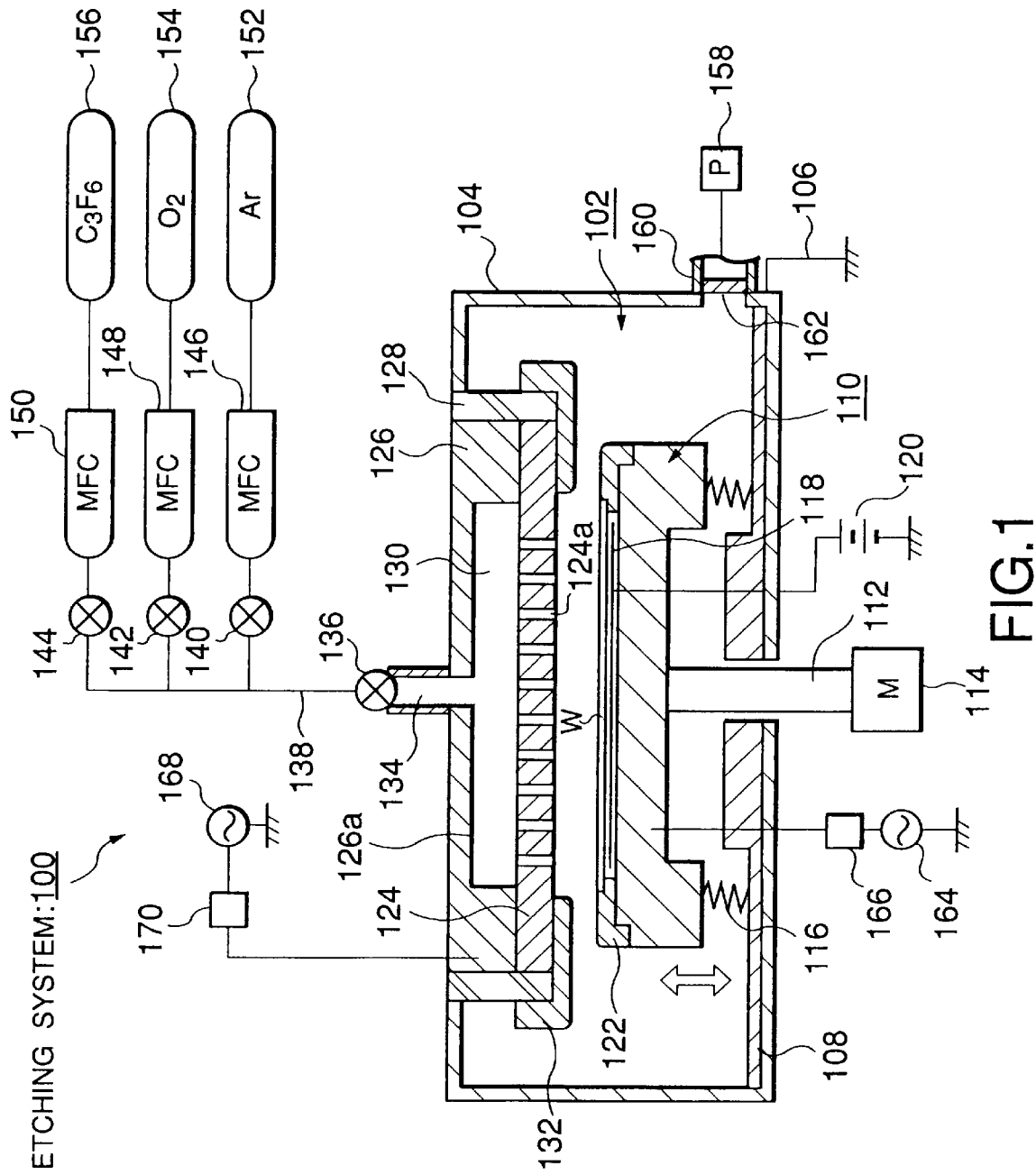
FIG. 1 is a schematic sectional view of the preferred embodiment of an etching system according to the present invention.

FIG. 1 shows a schematic cross-section of an etching system 100, to which the preferred embodiment of a dry etching method according to the present invention is applied.

The etching system 100 has a substantially cylindrical processing container 104 of, e.g., aluminum, the surface of which is anodized. The processing container 104 can be closed air tight, and defines a processing chamber 102 therein. The processing container 104 is grounded by means of a grounding line 106. An insulating supporting plate 108 of, e.g., a ceramic, is provided on the bottom portion in the processing chamber 102. Above the insulating supporting plate 108, a substantially cylindrical susceptor 110 serving as a lower electrode for supporting thereon an object to be processed, e.g., a wafer W of 6 inches, is provided in the processing chamber 102 so as to be movable in vertical directions.

The susceptor 110 is supported on an elevator shaft 112, which passes through the insulating supporting plate 108 and the bottom portion of the processing container 104. The elevator shaft 112 is movable in vertical directions by means of a driving motor M114 provided outside of the processing container 104. Thus, by operation of the driving motor M114, the susceptor 110 is movable in vertical directions as shown by the two-way arrow in FIG. 1. In order to ensure an airtight seal in the processing chamber 102, an extensible sealing member, e.g., a bellows 116, is provided between the susceptor 110 and the insulating supporting member 108 so as to surround the elevator shaft 112.

The susceptor 110 is made of, e.g., aluminum, the surface of which is anodized. In the susceptor 110, temperature control means, e.g., heating means such as a ceramic heater (not shown), and a refrigerant circulating line (not shown) for circulating a refrigerant between the inside of the susceptor 110 and an outside refrigerant source (not shown) are provided, so that the wafer W arranged on the susceptor 110 can be maintained at a predetermined temperature. The temperature of the susceptor 110 is automatically controlled by means of a temperature sensor (not shown) and a temperature control mechanism (not shown).

An electrostatic chuck 118 for adsorbing and holding the wafer W is provided on the susceptor 110. The electrostatic chuck 118 comprises a conductive film sandwiched by materials of a polyimide resin, which are arranged on the upper and lower surfaces of the conductive film. When a voltage of, e.g., 1.5 kV to 2.0 kV, is applied to the conductive film from a high-voltage DC power supply 120 provided outside of the processing container 104, the wafer W becomes charged and is held on the upper surface of the electrostatic chuck 118 by the produced Coulomb force.

On the peripheral portion of the susceptor 110, a substantially annular focus ring 122 is provided so as to surround the electrostatic chuck 118. The focus ring 122 is made of an insulating material, e.g., quartz, and serves to cause ions in plasma to be effectively focused on the wafer W. In addition, the focus ring 122 is associated with a shielding ring 132, which will be described later, to inhibit the diffusion of plasma produced between the susceptor 110 and a substantially cylindrical upper electrode 124, which will be described later.

The upper electrode 124 is arranged so as to face the mounting surface of the susceptor 110. The upper electrode 124 is made of conductive material, e.g., single crystal silicon, and has a plurality of through holes 124a. On the upper side of the upper electrode 124, an upper electrode supporting member 126 of a conductive material, e.g., aluminum, which has substantially the same diameter as that of the upper electrode 124, is arranged. The upper electrode supporting member 126 has an opening 126a, which faces the upper electrode 124 so as to form a space 130 between the upper electrode 124 and the upper electrode supporting member 126 when the upper electrode 124 is mounted on the upper electrode supporting member 126.

A substantially annular shielding ring 132 of an insulating material, e.g., quartz, is arranged so as to extend from the outer periphery of the lower surface of the upper electrode 124 to substantially the center of the outer periphery of the insulating ring 128. The shielding ring 132 is associated with the focus ring 122 to form a narrower gap than the gap formed between the electrostatic chuck 118 and the upper electrode 124, so as to inhibit the diffusion of plasma.

A gas inlet 134 is provided above the space 130 substantially at the center thereof. The gas inlet 134 is connected to a gas introducing pipe 138 via a valve 136. The gas introducing pipe 138 is connected to gas sources 152, 154 and 156 via valves 140, 142 and 144 and mass flow controllers MFC 146, 148 and 150, respectively.

The gas source 152 is provided for supplying, e.g., Ar, the gas source 154 is provided for supplying, e.g., $O_2$, and the gas source 156 is provided for supplying, e.g., $C_3F_6$. The gases supplied from these gas sources 152, 154 and 156 are introduced into the processing chamber 102 via the gas introducing pipe 138, the gas inlet 134, the space 130 and through holes 124a, to be uniformly supplied to the surface of the wafer W to be processed.

The processing container 104 is connected to an exhaust pipe 160 at the lower portion thereof. The exhaust pipe 160 is connected to evacuating means P158, such as a vacuum pump, for evacuating the interior of the processing chamber 102 to an optional degree of vacuum, e.g., few mTorr to hundreds mTorr, via an exhaust plate 162 comprising, e.g., a panting plate, to maintain the degree of vacuum.

A high-frequency power supply system of the etching system 100 will be described below.

To the susceptor 110, a high-frequency power having a frequency of hundreds kHz, e.g., 800 kHz, is supplied from a high-frequency power supply 164 via a matching unit 166. On the other hand, to the upper electrode 124, a high-frequency power having a frequency of 1 MHz or higher, e.g., 27.12 MHz, which is higher than the frequency of the high-frequency power supplied from the high-frequency power supply 164, is supplied from a high-frequency power supply 168 via a matching unit 170 and the upper electrode supporting member 126.

The principal part of the etching system 100 is formed as described above. An etching process of, e.g., $SiO_2$ film, formed on the wafer W using the preferred embodiment of a dry etching method, according to the present invention, will be described below.

First, when the wafer W is mounted on the susceptor 110, a predetermined voltage is applied from the high-voltage DC power supply 120 to the conductive film arranged in the electrostatic chuck 118, so that the wafer W is adsorbed and held on the electrostatic chuck 118. The susceptor 110 is maintained at a predetermined temperature by temperature control means (not shown), and the surface temperature of the wafer W held on the susceptor 110 is set to be equal to or less than 120° C. even during processing.

Then, the interior of the processing chamber 102 is evacuated by the evacuating means P158. In addition, gases required for the etching process are supplied from the gas sources 152, 154 and 156 to the processing chamber 102 at predetermined flow rates, and the opening of a gate valve (not shown) is adjusted to set and maintain the pressure in the processing chamber 102 at a predetermined degree of vacuum, e.g., 40 mTorr.

In this preferred embodiment, after the flow rates of Ar, $O_2$ and $C_3F_6$ supplied from the gas sources 152, 154 and 156 are regulated by the corresponding mass flow controllers MFC 146, 148 and 150 and the corresponding valves 140, 142 and 144, respectively, these gases are mixed to be introduced onto the wafer W via the gas introducing pipe 138, the gas inlet 134, the space 130 and the through holes 124a. The total pressure of the mixed gas is controlled by adjusting the opening of the gate valve (not shown) so that the flow ratio of $O_2$ to $C_3F_6$ is $0.1 \leq O_2/C_3F_6 \leq 1.0$, the flow rate of $O_2$ is a suitable value and the partial pressure of $C_3F_6$ is in the range of from 0.5 mTorr to 2.0 mTorr.

Then, when a high-frequency power of, e.g., 2 kW, having a frequency of 27.12 MHz is supplied from the high-frequency power supply 168 to the upper electrode 124, plasma is produced between the upper electrode 124 and the susceptor 110. Simultaneously, a high-frequency power of, e.g., 1 kW, having a frequency of 800 kHz is supplied from the high-frequency power supply 164 to the susceptor 110.

The processing gas in the processing chamber 102 is dissociated by the produced plasma to produce etchant ions, so that the $SiO_2$ film on the wafer W is etched by the produced etchant ions while the impingement rate of the etchant ions is controlled by a high frequency, which is relatively low and which is supplied to the susceptor 110.

The functions and effects of the etching process using the mixed gas in this preferred embodiment will be described below.

The respective gases introduced into the processing chamber 102 are directly emitted to the atmosphere if they have not contributed to the etching process. The processing gases used for conventional methods, e.g., $CF_4$ and $C_2F_6$, are very stable substances. Therefore, if such substances are emitted to the atmosphere, the green house effect is maintained for a long time to cause the earth anathermal.

Therefore, the inventors have noted $C_3F_6$ as a gas substituted for the conventionally used processing gases. It is considered that $C_3F_6$ does not cause the green house effect for a long time even if it is emitted to the atmosphere. In addition it is reported that $C_3F_6$ is particularly incombustible, low reactive and low toxic among perfluoro olefins, and can be easily handled similar to the conventionally used processing gases.

The etching capability of $C_3F_6$, which has caused problems, can be improved by using a mixed gas, which is obtained by mixing $C_3F_6$ with $O_2$ and Ar at predetermined flow rates in this preferred embodiment, so that it is possible to obtain substantially the same etching characteristic as that of c-$C_4F_8$, which has the best etching characteristic out of etching gases used for $SiO_2$ films.

The effects obtained by adding Ar will be described. If Ar is added, it is possible to obtain the dilution effect to suppress the partial pressure of $C_3F_6$ to a predetermined value while maintaining the total pressure at a predetermined value in the processing chamber 102, and to get the ion assist enhancing effect during the reactive ion etching (RIE) by Ar ions. If Ar is not added, it is required to provide a vacuum pump having a very high pumping speed in order to hold the partial pressure of $C_3F_6$. In addition, even if the partial pressure of $C_3F_6$ can be maintained at a predetermined value, the etching rate of the $SiO_2$ film is very slow since there is no ion assist effect obtained by, e.g., Ar ions. In a case where Ar is added, it is possible to ignore the deterioration of the etch selectivity to a photoresist due to Ar ions, since the sputtering rate of the photoresist due to Ar ions is very slow compared to the etching rate of $SiO_2$.

In addition, Ar serves to ensure etching of a contact hole with a desired high aspect ratio and to hold a high etching rate by maintaining the partial pressure $C_3F_6$ in the range of from 0.5 mTorr to 2.0 mTorr. In etching processes, the fact that a desired high aspect ratio of the contact hole can not be ensured means that semiconductor devices can not be patterned, and the fact that the etching rate is low means that the throughput during the fabrication of semiconductor devices is deteriorated.

For example, if the partial pressure of $C_3F_6$ is set to be equal to or higher than 2.0 mTorr, it is not possible to ensure etching of a contact hole with a sufficiently high aspect ratio as desired, and it is difficult to cause an etching process to progress. This mechanism may be considered as follows.

First, when $C_3F_6$ is decomposed into neutral radicals in plasma to some extent, the radicals are absorbed onto the surface of the wafer W. At the active site of the wafer W, onto which the radicals are absorbed, ion bombardment assists the radicals to react with the $SiO_2$ film of the wafer W to produce a volatile matter to cause the etching to progress, or to react with each other to produce a non-volatile matter, i.e., a deposition, to cause the adhesion thereof to progress.

When the partial pressure of $C_3F_6$ is high, the energy supplied to $C_3F_6$ in the plasma per molecule is too low to cause the progress of sufficient dissociation, so that the active site has rich C—C bonds. Since the active site having the rich C—C bonds contributes to the adhesion of deposition in comparison with the progress of etching, an excess amount of CF film formed by the deposition is produced on the wafer W, so that the etching is difficult to progress. In particular, it is difficult for the ions for assisting the etching to reach the bottom portion of the contact hole having a high aspect ratio, so that the adhesion of the deposition further progresses in accordance with the above described mechanism. Finally, the etching is stopped.

On the other hand, if the partial pressure of $C_3F_6$ is set to be equal to or less than, e.g., 0.5 mTorr, the etching rate decreases. Although the reason for this is considered that as the amount of the etchant decreases, it is presumed that the etching rate decreases by the synergistic effect with another mechanism. If the partial pressure of $C_3F_6$ is low, the energy supplied to $C_3F_6$ in the plasma per molecule is high, so that the dissociation of $C_3F_6$ in the plasma excessively progresses and the amount of the recombined radicals decreases. Consequently, the radicals having rich C and a small F/C ratio are excessively produced. These radicals are known as radicals for producing a deposition. Therefore, if the partial pressure of $C_3F_6$ is equal to or less than 0.5 mTorr, excess deposition of a CF film is produced on the wafer W to inhibit the etching.

Therefore, the progress of the etching and the progress of adhesion of the deposition are suitably controlled by maintaining the partial pressure of $C_3F_6$ in the range of from 0.5 mTorr to 2.0 mTorr, so that it is possible to maintain a high etching rate while ensuring etching of a contact hole with a desired high aspect ratio.

Then, the effects obtained by adding $O_2$ will be described. The $O_2$ serves to promote the ashing effect to remove the film formed by the adhesion of deposition, to cause the etching to progress. In addition, $O_2$ serves to draw C out of the radicals to produce radicals having a higher F/C ratio. These radicals contribute to etching more than the adhesion of deposition. Moreover, an O radical tends to reach the bottom of the contact hole since it has a small diameter. Therefore, the addition of $O_2$, is effective for the prevention of the etching stop at the bottom of the contact hole, in which the ion assisting effect is small and the adhesion of deposition is great.

As described above, $O_2$ has superior effects. However, when the amount of $O_2$ supplied to the processing chamber 102 is a certain value, such effects can not be sufficiently obtained. In addition thereto, a bad influence may be caused. For example, if the flow ratio of $O_2$ to $C_3F_6$ in the standard state is set to be smaller than 0.1, the effects obtained by adding $O_2$ can not be obtained. In addition, in the etching of the bottom portion of the contact hole, the adhesion rate of the deposition is greater than the etching rate to cause the etching stop, so that it is not possible to ensure a sufficient desired high aspect ratio. On the other hand, if the flow ratio of $O_2$ to $C_3F_6$ in the standard state is set to be greater than 1.0, the film of deposition is not formed on the surface of the photoresist, and the ashing of the photoresist is carried out by O radicals, so that the etch selectivity to the photoresist is deteriorated.

Therefore, the progress of etching and the formation of the film of the deposition can be suitably controlled by maintaining the flow ratio of $O_2$ to $C_3F_6$ in the standard state to be in the range of from 0.1 to 1.0, so that it is possible to ensure etching of a contact hole with a desired high aspect ratio and to ensure a high etching rate of the contact hole without excessively etching the photoresist.

In this preferred embodiment, the mixed gas is set as described above. If He is added to the mixed gas, the etching capability may be improved. In the etching process, as the mean free path increases, it is possible to prevent the scattering of ion species due to the impingement of the ion species in the contact hole. Comparing the case that He is added to the mixed gas with the case that He is not added thereto at the same pressure, a lower pressure effect can be obtained when He is added.

In addition, since He has a smaller atomic weight than that of Ar, it is difficult to be evacuated by the evacuating means P158. However, He is easy to be uniformly dispersed in the processing chamber 102, so that it is possible to uniformly process the wafer W. Moreover, the ionization potential of He is 24.6 eV, which is greater than 15.8 eV of Ar. Since the electron temperature in plasma depends on the ionization potential of a rare gas, when He is added to the mixed gas, it is possible to obtain a higher electron temperature, so that it is possible to further promote the dissociation of an etchant gas.

However, since He has a smaller atomic radius than that of Ar, the ion assist effect of He is small. Therefore, if an etching process is carried out using a mixed gas of $C_3F_6$, $O_2$ and He in place of Ar in the mixed gas, the etching capability is deteriorated. Therefore, preferably, the flow rate of Ar in the mixed gas in this preferred embodiment is suitably decreased to introduce He at a flow rate corresponding to the difference from the flow rate of Ar, which is originally to be introduced into the processing chamber 102. Thus, it is possible to obtain only the superior effects of Ar and He as described above. In this case, the flow rate of He, i.e., the flow ratio of He and Ar, is preset by experimentally obtaining the optimum value.

EXAMPLE 1

Figure 3:
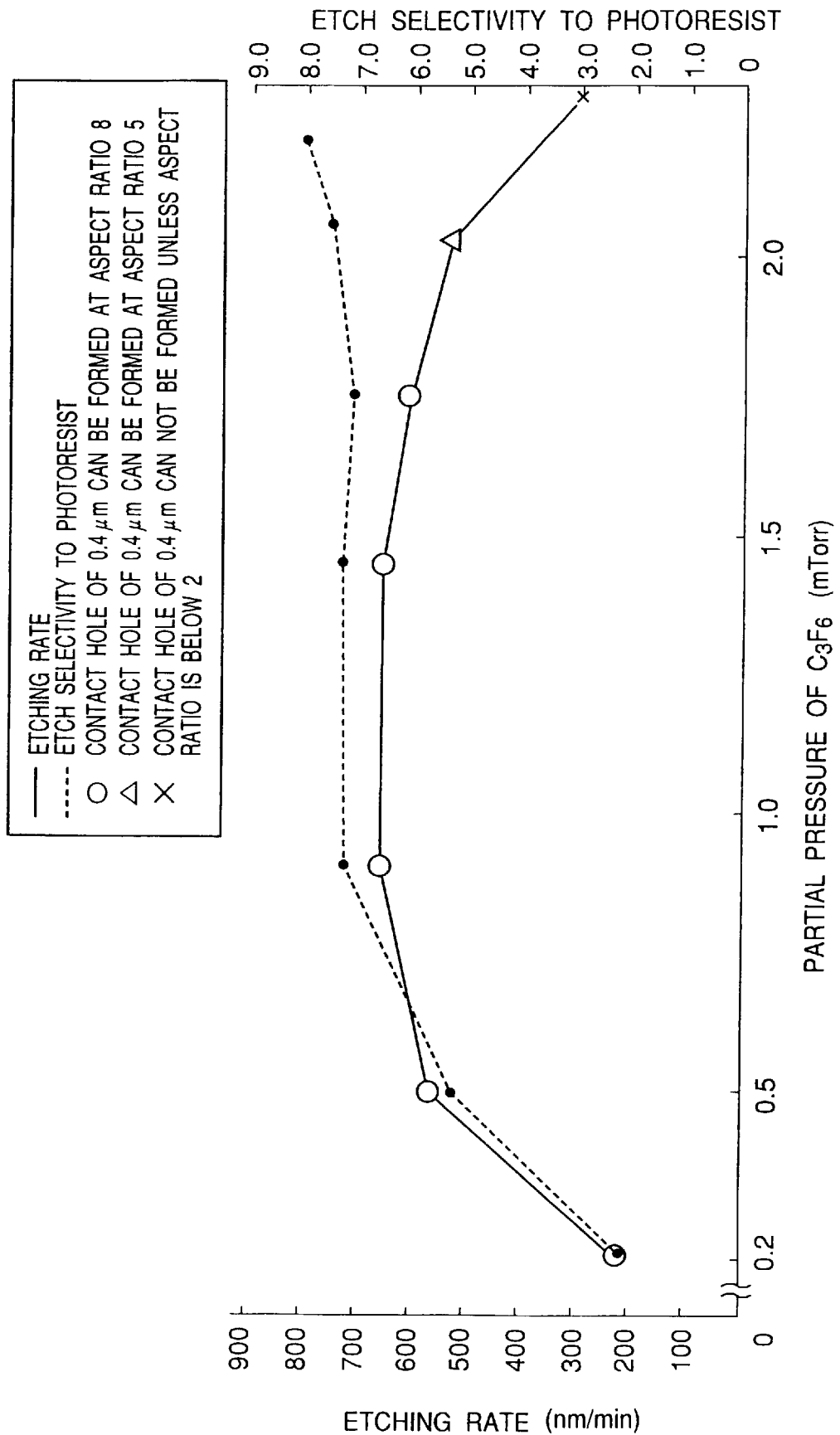
FIG. 3 is a graph showing the etching characteristics of FIG. 2.

FIGS. 2 and 3 show the results of the etching characteristics using a mixed gas of $C_3F_6$, Ar and $O_2$ as a gas for an etching process using the etching system 100, when the flow rate of $C_3F_6$ was changed. A wafer W having a diameter of 6 inches, on the surface to be processed of which a $SiO_2$ film was formed, was used as an object to be processed. The process pressure in the processing chamber 102 was maintained to be 40 mTorr. The flow rate of Ar was fixed to be 560 sccm, the flow rate of $O_2$ was fixed to be 3 sccm, and the flow rate of $C_3F_6$ was changed, so that the partial pressure of $C_3F_6$ was controlled. The temperature of the susceptor 110 was set to be 40° C. A high-frequency power of 2000 W having a frequency of 27.12 MHz was applied to the upper electrode 124, and a high-frequency power of 900 W having a frequency of 0.8 MHz was applied to the susceptor 110 serving as the lower electrode. The surface temperature of the wafer W was about 90° C. when it was measured by a surface-temperature measuring seal.

EXAMPLE 2

Figure 5:
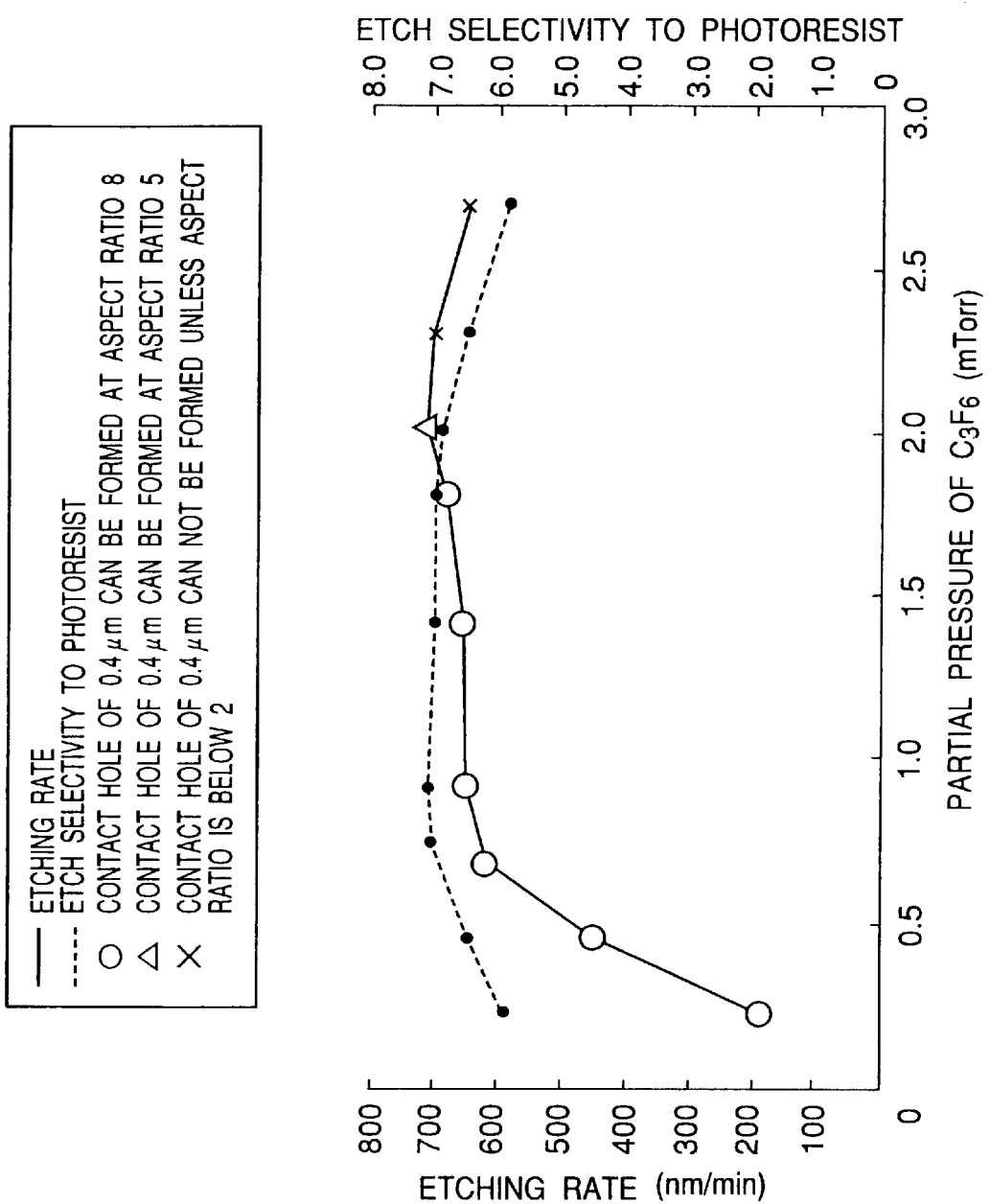
FIG. 5 is a graph showing the etching characteristics of FIG. 4.

FIGS. 4 and 5 show the results of the etching characteristics when the total pressure in the processing chamber 102 was changed. The flow rate of $C_3F_6$ was fixed to be 13 sccm, the flow rate of Ar was fixed to be 560 sccm and the flow rate of $O_2$ was fixed to be 3 sccm. In addition, the flow ratio of $O_2/C_3F_6$ in the standard state was maintained to be 0.23, and the total pressure was changed by controlling the exhaust valve (not shown), so that the partial pressure of $C_3F_6$ was controlled. Other conditions were the same as those in Example 1.

EXAMPLE 3

FIGS. 6 and 7 show the results of the etching characteristics when the flow rate of $O_2$ was changed. The process pressure in the processing chamber 102 was maintained to be 40 mTorr, the flow rate of Ar was fixed to be 560 sccm and the flow rate of $C_3F_6$ was fixed to be 13 sccm. Other conditions were the same as those in Example 1.

As can be seen from the results in Examples 1 through 3 shown in FIGS. 2 through 7, when the flow ratio of $O_2$ to $C_3F_6$ is in the range of $0.1 \leq O_2/C_3F_6 \leq 1.0$ and the partial pressure of $C_3F_6$ is in the range of from 0.5 mTorr to 2.0 mTorr, the etching rate of the $SiO_2$ film is equal to or greater than 500 nm/min, the etch selectivity of the $SiO_2$ to the photoresist layer is equal to or greater than about 5, and the contact hole having a diameter of 0.4 μm can be formed at an aspect ratio of 5. Therefore, it is possible to obtain a desired etching characteristic by setting the flow ratio and the partial pressures of the respective gases forming the mixed gas to be the above described ranges.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

While the etching process has been carried out using a parallel plate type etching system 100 in the preferred embodiment described above, the present invention should not be limited thereto. For example, the present invention may be applied to an etching process using an inductively coupled plasma etching system or a microwave plasma etching system.

In addition, while the high-frequency powers have been applied to both of the upper electrode 124 and the susceptor 110 in the preferred embodiment described above, the present invention should not be limited thereto, but a high-frequency power may be applied only to the susceptor.

As described above, according to the present invention, since $C_3F_6$ is used for producing plasma, even if the $C_3F_6$ does not contribute to an etching process to be directly emitted to the atmosphere, it is hydrolyzed in the atmosphere, so that it is difficult to cause the earth warming due to the green house effect. In addition, since a mixed gas containing $O_2$ and Ar in addition to $C_3F_6$ is used for an etching process, it is possible to ensure substantially the same etching characteristic as that of, e.g., $c-C_4F_8$.

What is claimed is:

1. A dry etching method comprising the steps of:

preparing a processing gas being a mixed gas consisting essentially of $C_3F_6$, $O_2$ and Ar;

introducing said processing gas into a pressure-diminishable processing chamber;

producing plasma in said processing chamber under a reduced-pressure atmosphere; and etching a silicon oxide layer formed on a surface to be processed, of an object to be processed in said processing chamber, wherein a flow ratio of said $O_2$ to said $C_3F_6$ of said mixed gas is set to be $0.1 \leq O_2/C_3F_6 \leq 1.0$, and a partial pressure of said $C_3F_6$ in said mixed gas is set to be in a range of from 0.5 mTorr to 2.0 mTorr, and said processing gas is introduced uniformly on said surface to be processed.

2. A dry etching method comprising the steps of:

preparing a processing gas being a mixed gas consisting essentially of $C_3F_6$, $O_2$, Ar and He;

introducing said processing gas into a pressure-diminishable processing chamber;

producing plasma in said processing chamber under a reduced-pressure atmosphere, said He promoting dissociation of said $C_3F_6$; and etching a silicon oxide layer formed on a surface to be processed, of an object to be processed in said processing chamber, wherein a flow ratio of said $O_2$ to said $C_3F_6$ of said mixed gas is set to be $0.1 \; O_2/C_3F_6 \leq 1.0$, $\leq 1.0$, and a partial pressure of said $C_3F_6$ in said mixed gas is set to be in a range of from 0.5 mTorr to 2.0 mTorr, and said processing gas is introduced uniformly on said surface to be processed.

* * * * *